(12) United States Patent
Harada et al.

(10) Patent No.: US 10,815,260 B2
(45) Date of Patent: Oct. 27, 2020

(54) CHEMICAL VAPOR DEPOSITION RAW MATERIAL INCLUDING DINUCLEAR RUTHENIUM COMPLEX AND CHEMICAL DEPOSITION METHOD USING CHEMICAL VAPOR DEPOSITION RAW MATERIAL

(71) Applicant: TANAKA KIKINZOKU KOGYO K.K., Chiyoda-ku, Tokyo (JP)

(72) Inventors: Ryosuke Harada, Tsukuba (JP);
Toshiyuki Shigetomi, Tsukuba (JP);
Tasuku Ishizaka, Tsukuba (JP);
Tatsutaka Aoyama, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 242 days.

(21) Appl. No.: 15/744,751

(22) PCT Filed: Aug. 23, 2016

(86) PCT No.: PCT/JP2016/074465
§ 371 (c)(1),
(2) Date: Jan. 12, 2018

(87) PCT Pub. No.: WO2017/033913
PCT Pub. Date: Mar. 2, 2017

(65) Prior Publication Data
US 2018/0201636 A1    Jul. 19, 2018

(30) Foreign Application Priority Data
Aug. 25, 2015  (JP) .................................. 2015-165340

(51) Int. Cl.
*C23C 16/16*    (2006.01)
*C07F 15/00*    (2006.01)
(Continued)

(52) U.S. Cl.
CPC .......... *C07F 15/00* (2013.01); *C07F 15/0046* (2013.01); *C09D 1/00* (2013.01);
(Continued)

(58) Field of Classification Search
CPC ...... C23C 16/16; C23C 16/18; C07F 15/0046
See application file for complete search history.

(56) References Cited

U.S. PATENT DOCUMENTS 5,372,849 A * 12/1994 McCormick ............ C23C 16/18
427/252
2006/0068588 A1 3/2006 Yamasaki et al.

FOREIGN PATENT DOCUMENTS

JP    6-173007 A    6/1994
JP    2005-2099 A   1/2005
(Continued)

OTHER PUBLICATIONS

PCT, International Search Report for PCT/JP2016/074465, dated Oct. 4, 2016.
(Continued)

*Primary Examiner* — Elizabeth A Burkhart
(74) *Attorney, Agent, or Firm* — Orrick, Herrington & Sutcliffe LLP; Joseph A. Calvaruso; K. Patrick Herman

(57) ABSTRACT

The present invention relates to a chemical vapor deposition raw material for producing a ruthenium thin film or a ruthenium compound thin film by a chemical deposition method, the chemical vapor deposition raw material including a dinuclear ruthenium complex in which carbonyl and a nitrogen-containing organic ligand (L) are coordinated to metallically bonded two rutheniums, the dinuclear ruthenium complex being represented by the following formula (1): A raw material according to the present invention is capable of producing a high-purity ruthenium thin film, and
(Continued)

has a low melting point and moderate thermal stability. Thus, the raw material according to the present invention is suitable for use in electrodes of various kinds of devices.

[Chemical Formula 1]

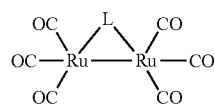

(1)

[Chemical Formula 2]

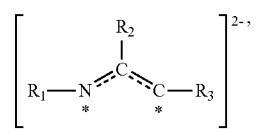

(L-1)

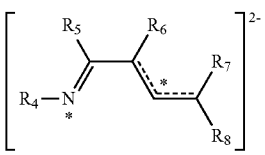

(L-2)

17 Claims, 3 Drawing Sheets (51) Int. Cl.
C23C 16/455 (2006.01)
C23C 16/18 (2006.01)
C09D 1/00 (2006.01)
C09D 5/24 (2006.01)
H01L 21/285 (2006.01)
H01L 21/3205 (2006.01)

(52) U.S. Cl.
CPC ............... *C09D 5/24* (2013.01); *C23C 16/16* (2013.01); *C23C 16/18* (2013.01); *C23C 16/45553* (2013.01); *H01L 21/28568* (2013.01); *H01L 21/28556* (2013.01); *H01L 21/32051* (2013.01)

(56) References Cited

FOREIGN PATENT DOCUMENTS

JP 2008-514821 A 5/2008
JP 2009-19263 A 1/2009
WO WO 2015/093177 A1 6/2015

OTHER PUBLICATIONS

EP, Extended Search Report for European application No. 16839260.3, dated Jul. 9, 2018.
Polm et al., Reactions of Monoazadienes with Metal Carbonyl Complexes—III. Thermal Conversion of N-Alkyl-(E)-Crotonaldimine with $Ru_3(CO)_{12}$ to $\sigma$-N,$\mu_2$-$\eta^3$-Allyl and $\mu_2$-$\eta^3$-Azaallyl Bonded Six Electron Fragments Coordinated to a Hexacarbonyl Diruthenium Unit. X-ray Single Crystal Structure Determinations of $Ru_2(CO)_6${$\sigma$-N,$\mu_2$-$\eta^3$—$CH_2CC(H)C(H)$=N-$C_4H_9$-t} and $Ru_2(CO)_6${$\mu_2$-$\eta^3$-$C_2H_5$—CC(H)N—$C_4H_9$-t}, Polyhedron, vol. 7, No. 24, Jan. 1, 1988, pp. 2521-2530.

* cited by examiner

TEST No. 2

TEST No. 4

CHEMICAL VAPOR DEPOSITION RAW MATERIAL INCLUDING DINUCLEAR RUTHENIUM COMPLEX AND CHEMICAL DEPOSITION METHOD USING CHEMICAL VAPOR DEPOSITION RAW MATERIAL

TECHNICAL FIELD

The present invention relates to a chemical vapor deposition raw material including a dinuclear ruthenium complex, which is used for producing a ruthenium thin film or a ruthenium compound thin film by a chemical deposition method such as a CVD method or an ALD method. Specifically, the present invention relates to a chemical vapor deposition raw material which is capable of forming a ruthenium thin film or the like that is liquid at normal temperature while having moderate thermal stability.

BACKGROUND ART

Ruthenium (Ru) thin films or ruthenium compound thin films are used as electrodes in various devices such as transistors (FETs) and flash memories which are incorporated in integrated circuits (LSI, ULSI and CPU). For these electrodes, structural modifications such as micronization and solidification, and use of a ruthenium thin film freed of impurities for reduction of resistance are required. For production of the ruthenium thin film, chemical deposition methods (chemical vapor deposition method (CVD method) and atomic layer deposition method (ALD method)) are used.

As a raw material for production of a ruthenium thin film by a chemical deposition method, many organic ruthenium compounds have been heretofore known. Examples of compounds capable of producing a high-purity ruthenium thin film include chemical vapor deposition raw materials including an organic ruthenium compound as disclosed in, for example, Patent Document 1 or Patent Document 2.

When the complex disclosed in each of the above-mentioned patent documents is used as a chemical vapor deposition raw material, a ligand is easily released as a gas during decomposition, and hardly caught in a thin film, so that a high-purity ruthenium thin film is easily formed. Specifically, Patent Document 1 discloses dodecacarbonyltriruthenium $Ru_3(CO)_{12}$ in which twelve carbonyl ligands are coordinated to ruthenium. Patent Document 2 discloses a tetrakis (μ-carboxy)diruthenium derivative to which a ligand represented by the following formula is coordinated.

[Chemical Formula 1]

The complex disclosed in Patent Document 1 is a trinuclear complex containing three rutheniums, and the complex disclosed in Patent Document 2 is a dinuclear complex containing two rutheniums. These dinuclear complexes have a metal-metal bond, and therefore it is considered that a high-purity ruthenium thin film is easily obtained. This is because when a metal-metal bond is present, transition from a molecular state to a bulk state (metallization) may more easily occur in formation of a thin film as compared to a mononuclear complex including one ruthenium, and also, presence of a metal-metal bond accordingly reduces the number of ligands bonded to a metal, so that the ratio of the metal in the raw material (metal concentration) is increased.

RELATED ART DOCUMENTS

Patent Documents

Patent Document 1: JP 2008-514821 A
Patent Document 2: JP 2009-19263 A

SUMMARY OF THE INVENTION

Problems to be Solved by the Invention

As described above, with the complexes disclosed in Patent Documents 1 and 2, a high-purity ruthenium thin film can be produced, but the complexes are not necessarily satisfactory when required properties of a chemical vapor deposition raw material are taken into consideration. That is, the chemical vapor deposition raw material has preferably all of a plurality of required properties in a well-balanced manner, but the complexes disclosed in the above-mentioned patent documents do not have some of the required properties. Here, as the required properties of the chemical vapor deposition raw material, for example, the chemical vapor deposition raw material has a low melting point, is preferably liquid at normal temperature, is stably vaporized without being deposited during vaporization, and is easily decomposed during formation of a thin film, so that a high-purity thin film can be formed.

Specifically, the complexes disclosed in the above-mentioned patent documents have a relatively high melting point, and are solid at normal temperature. Thus, for example, the raw material disclosed in Patent Document 1 has low thermal stability although a solid in the raw material is melted by heating during formation of a thin film at 154 to 155° C., and therefore the compound is decomposed concurrently with the melting, so that it is difficult to stably vaporize the raw material. The raw material in Patent Document 2 has a high melting point, and is therefore used as a liquid with the raw material dissolved in an organic solvent etc. during formation of a thin film, and thus ingress of impurities derived from the organic solvent, and harmfulness and combustibility of the organic solvent itself become a problem.

Against the background described above, an object of the present invention is to provide a chemical vapor deposition raw material which has a low melting point, is preferably liquid at normal temperature, has moderate thermal stability, and is capable of forming a high-purity ruthenium thin film or ruthenium compound thin film.

Means for Solving the Problems

As a solution of the above-mentioned problems, the present inventors have extensively conducted studies on a ruthenium complex including a plurality of carbonyl ligands and having an improved melting point and improved thermal stability. As described above, a ruthenium complex including a plurality of carbonyl ligands releases ligands as a gas during decomposition, and easily forms a high-purity ruthenium thin film. As a result, the present inventors have found that when an organic ligand containing one nitrogen atom is bridge-coordinated in a dinuclear ruthenium complex having two rutheniums as a central metal, the dinuclear ruthenium complex has a low melting point and moderate thermal stability, and is thus suitable as a chemical vapor deposition raw material, and have conceived the present invention.

The present invention relates to a chemical vapor deposition raw material for producing a ruthenium thin film or a ruthenium compound thin film by a chemical deposition method, including a dinuclear ruthenium complex in which carbonyl and a nitrogen-containing organic ligand (L) are coordinated to metallically bonded two rutheniums, the dinuclear ruthenium complex being represented by the following formula (1):

[Chemical Formula 2]

(1)

wherein L represents an organic ligand containing one nitrogen atom, the ligand being represented by the following formula (L-1) or (L-2):

[Chemical Formula 3]

wherein * represents a position of an atom bridge-coordinated to ruthenium; and $R_1$ to $R_8$ may be the same or different, and each represent any one of a hydrogen atom and an alkyl group with a carbon number of 1 or more and 4 or less.

The chemical vapor deposition raw material of the present invention is a dinuclear ruthenium complex including metallically bonded two rutheniums as a central metal of the complex, and at the central metal, an organic ligand (L) and a carbonyl ligand (—CO) bridge-coordinated to ruthenium are present as ligands. The complex serves as a chemical vapor deposition raw material which has a low melting point and is easily liquefied at normal temperature and which has moderate thermal stability in formation of a ruthenium thin film.

In addition, in the raw material of the present invention, a raw material having a suitable vapor pressure and melting point as a chemical vapor deposition raw material can be obtained by arbitrarily designing the total number of carbon atoms in the organic ligand (L) and each of substituents $R_1$ to $R_8$ as described later.

Hereinafter, the dinuclear ruthenium complex that forms the chemical vapor deposition raw material according to the present invention will be described in detail.

In the chemical vapor deposition raw material of the present invention, the central metal is one in which two rutheniums are metallically bonded to each other. In this way, the raw material has a metallic bond of rutheniums, and thus when a thin film is formed from such a raw material, a high-purity ruthenium thin film is easily obtained.

The organic ligand (L) as a ligand will now be described. L represents a monoimine containing one nitrogen atom. The reason why a monoimine is applied as described above is that it has been found that introduction of a nitrogen atom tends to easily vary the thermal stability and vapor pressure of the complex. A ligand having no nitrogen atom tends to have low thermal stability, and on the other hand, when a ligand having one amine is applied as in the present invention, a raw material having high thermal stability is easily obtained.

Specifically, any one of organic ligands (L-1 and L-2) of structures as shown below can be applied as an organic ligand. One ligand is bridge-coordinated to two rutheniums at two positions in the ligand. In the present invention, the term "bridge-coordinated" means that one organic ligand is three-dimensionally coordinated to two rutheniums so as to bridge the rutheniums. Specifically, the ligand is coordinated to rutheniums at two positions represented by * in the organic ligand (L-1 or L-2) to be bridge-coordinated (one ligand is bridge-coordinated to two rutheniums).

[Chemical Formula 4]

Here, the three-dimensional structure of a dinuclear ruthenium complex in which organic ligands L-1 and L-2 are bridge-coordinated. When one nitrogen atom in a monoimine as a ligand is coordinated to ruthenium in this way, a chemical vapor deposition raw material having high thermal stability is easily obtained as described above.

[Chemical Formula 5]

Substituents $R_1$ to $R_8$ in the organic ligand (L) will now be described. As described above, in the present invention, a raw material having a suitable melting point and suitable thermal stability can be obtained as a chemical vapor deposition raw material by arbitrarily designing the total number of carbon atoms in the organic ligand L. The total number of carbon atoms in the organic ligand L is preferably 3 or more and 10 or less in terms of the total number of carbon atoms in substituents $R_1$ to $R_3$ for the organic ligand L-1. In addition, the total number of carbon atoms in substituents $R_4$ to $R_8$ is preferably 2 or more and 10 or less for the organic ligand L-2.

Substituents $R_1$ to $R_8$ may be the same or different, and each represents any one of a hydrogen atom and an alkyl group with a carbon number of 1 or more and 4 or less. When each of substituents $R_1$ to $R_8$ is an alkyl group, the alkyl group may be either linear or branched. The alkyl group is preferably any one of a methyl group, an ethyl group, a propyl group and a butyl group. When the carbon chain is excessively long, the vapor pressure of the complex tends to decrease, and in the case of a long-chain alkyl group with a carbon number of more than 5, the complex is difficult to vaporize.

Preferred types of substituents as substituents $R_1$ to $R_3$ in the organic ligand L-1 will be described. $R_1$ and $R_3$ may be the same or different, and at least one of the substituents is preferably an ethyl group, a propyl group or a butyl group. Each of $R_1$ and $R_3$ is also preferably a branched alkyl group. Specifically, as a preferred substituent, an ethyl group, an n-propyl group, an iso-propyl group, an n-butyl group, an iso-butyl group, a sec-butyl group, a tert-butyl group or the like can be applied, and an ethyl group, an iso-propyl group, an iso-butyl group, a sec-butyl group or a tert-butyl group is preferable.

$R_2$ is preferably a hydrogen atom or a methyl group, especially preferably a hydrogen atom. The substituent $R_2$ is positioned in a three-dimensional direction with respect to a plane on which ruthenium is metallically bonded at the time when the organic ligand L is bridge-coordinated to ruthenium, and when the substituent has a small number of carbon atoms, a complex apt to be stably vaporized is easily obtained.

Preferred types of substituents as substituents $R_4$ to $R_8$ in the organic ligand L-2 will now be described. The substituent $R_4$ is preferably any one of an ethyl group, a propyl group and a butyl group. The substituent $R_4$ is also preferably a branched alkyl group. Specifically, as a preferred substituent, an ethyl group, an n-propyl group, an iso-propyl group, an n-butyl group, an iso-butyl group, a sec-butyl group, a tert-butyl group or the like can be applied, and an ethyl group, an iso-propyl group, an iso-butyl group, a sec-butyl group or a tert-butyl group is preferable.

$R_5$, $R_6$, $R_7$ and $R_8$ may be the same or different, and are each preferably a hydrogen atom or a methyl group, especially preferably a hydrogen atom. The substituents ($R_5$, $R_6$, $R_7$ and $R_8$) are each positioned in a three-dimensional direction with respect to a plane on which ruthenium is metallically bonded at the time when the organic ligand L is bridge-coordinated to ruthenium, and when the substituents have a small number of carbon atoms, a complex apt to be stably vaporized is easily obtained.

The carbonyl ligand (—CO) will now be described. In the complex in the present invention, six carbonyls (CO) in total are coordinated, and three carbonyls are coordinated to each ruthenium. As described above, the carbonyl ligand (—CO) is easily released as a gas during decomposition, and more easily separated from the central metal as compared to the organic ligand (L). Thus, the complex in the present invention contains carbonyl ligands in a relatively large amount, and consequently forms a compound which has a small molecular weight, and is easily vaporized as a chemical vapor deposition raw material, and also the complex is hardly thermally decomposed in a vaporization stage before film formation, so that stable vaporization is easily attained.

Specifically, preferred types of dinuclear ruthenium complexes for the above-described chemical vapor deposition raw material of the present invention are listed below as examples.

[Chemical Formula 6]

[Chemical Formula 7]

The chemical vapor deposition raw material of the present invention can be produced by, for example, a method in which a ruthenium compound as a starting material is reacted with aldimine added as an imine compound. As the ruthenium compound, for example, dodecacarbonyltriruthenium or the like can be used.

The above-described chemical vapor deposition raw material according to the present invention is useful for formation of a ruthenium thin film by a CVD method. This thin film formation method includes preparing a reaction gas by vaporizing a raw material including an organic ruthenium compound, introducing the reaction gas to a substrate surface, and decomposing the organic ruthenium compound to deposit ruthenium. In this method, the ruthenium compound according to the present invention is used as a raw material.

The reaction atmosphere during formation of ruthenium is preferably a reducing atmosphere. The raw material of the present invention tends to exhibit favorable low-temperature film formation property particularly in a reducing atmosphere. In addition, in a reducing atmosphere, oxidation of other metal thin film that is formed together with ruthenium can also be suppressed when a three-dimensional electrode of FET is formed. As a reducing atmosphere, it is preferable to introduce hydrogen or ammonia, especially preferably hydrogen as a reaction gas.

The heating temperature for film formation reaction is preferably 100° C. to 400° C. When the heating temperature is lower than 100° C., the film formation hardly proceeds, and thus a required thickness is hard to obtain. When the heating temperature is higher than 400° C., formation of a uniform thin film is difficult.

Advantageous Effects of the Invention

As described above, a ruthenium complex as a chemical vapor deposition raw material according to the present invention is capable of producing a high-purity ruthenium thin film, and has a low melting point and moderate thermal stability. The raw material according to the present invention is applicable not only to a CVD method but also to a chemical deposition method such as an atomic layer deposition method (ALD method).

DESCRIPTION OF EMBODIMENTS

Hereinafter, the best embodiments in the present invention will be described.

The following ruthenium complexes were each synthesized, and evaluated for physical properties, and a film formation test of a ruthenium thin film was conducted with the synthesized complex as a chemical vapor deposition raw material.

[Chemical Formula 8]

Example 1

Example 2

Example 3

Example 4

Example 5

EXAMPLE 1

Hexacarbonyl[μ-[(1,2-η)-N-ethyl-3-methyl-1-butene-1-aminato-κC$^2$,κN$^1$:κN$^1$]]diruthenium (Ru—Ru) was produced. The synthesis reaction formula is as described below. Hereinafter, the production process will be described in detail.

[Chemical Formula 9]

6.4 g (10 mmol) of dodecacarbonyltriruthenium and 3.3 g (30 mmol) of N-ethylsenecialdimine were added in a flask containing 400 ml of heptane, and the mixture was refluxed for 24 hours. The mixture was cooled to room temperature, the solvent was then distilled off under a reduced pressure, and purification was performed by a silica gel column with hexane as a developing solvent. Distillation was further performed to obtain 1.4 g (3.0 mmol) of hexacarbonyl[μ-[(1,2-η)-N-ethyl-3-methyl-1-butene-1-aminato-κC$^2$,κN$^1$:κN$^1$]]diruthenium (Ru—Ru) as an intended product (yield: 20%, melting point: 34° C.). $^1$H NMR (CDCl$_3$): δ6.88 (1H, s), 2.6 (2H, q), 2.61-2.51 (1H, m), 1.08 (6H, d), 0.91 (3H, t).

EXAMPLE 2

Hexacarbonyl[μ-[(1,2-η)-3-methyl-N-(1-methylethyl)-1-butene-1-aminato-κC$^2$,κN$^1$:κN$^1$]]diruthenium (Ru—Ru) was produced. The synthesis reaction formula is as described below. Hereinafter, the production process will be described in detail.

[Chemical Formula 10]

6.4 g (10 mmol) of dodecacarbonyltriruthenium and 3.8 g (30 mmol) of N-isopropylsenecialdimine were added in a flask containing 400 ml of heptane, and the mixture was refluxed for 24 hours. The mixture was cooled to room temperature, the solvent was then distilled off under a reduced pressure, and purification was performed by a silica gel column with hexane as a developing solvent. Sublimation/purification was further performed to obtain 3.7 g (7.5 mmol) of hexacarbonyl[μ-[(1,2-η)-3-methyl-N-(1-methylethyl)-1-butene-1-aminato-κC$^2$,κN$^1$:κN$^1$]]diruthenium (Ru—Ru) as an intended product (yield: 50%, melting point >150° C.). $^1$H NMR (CDCl$_3$): δ6.88 (1H, s), 2.62-2.55 (1H, m), 2.43-2.37 (1H, m), 1.09 (6H, d), 0.91 (6H, d).

EXAMPLE 3

Hexacarbonyl[μ-[(1,2-η)-3-methyl-N-(1-methylpropyl)-1-butene-1-aminato-κC$^2$,κN$^1$:κN$^1$]]diruthenium (Ru—Ru) was produced. The synthesis reaction formula is as described below. Hereinafter, the production process will be described in detail.

[Chemical Formula 11]

6.4 g (10 mmol) of dodecacarbonyltriruthenium and 4.2 g (30 mmol) of N-sec-butylsenecialdimine were added in a flask containing 400 ml of heptane, and the mixture was refluxed for 24 hours. The mixture was cooled to room temperature, the solvent was then distilled off under a reduced pressure, and purification was performed by a silica gel column with hexane as a developing solvent. Distillation was further performed to obtain 3.3 g (6.5 mmol) of hexacarbonyl[μ-[(1,2-η)-3-methyl-N-(1-methylpropyl)-1-butene-1-aminato-κ$C^2$,κ$N^1$:κ$N^1$]]diruthenium (Ru—Ru) as an intended product (yield: 43%, melting point <−20° C.). $^1$H NMR (CDCl$_3$): δ6.88 (1H, s), 2.63-2.53 (1H, m), 2.06-1.98 (1H, m), 1.22-1.15 (2H, m), 1.10 (3H, m) 1.09 (3H, d), 0.89 (3H, t), 0.85 (3H, d).

EXAMPLE 4

Hexacarbonyl[μ-[η:η$^3$-1-[[(1-methylethyl)imino]ethenylidene]-1,2-ethanediyl-N]]diruthenium (Ru—Ru) was produced. The synthesis reaction formula is as described below. Hereinafter, the production process will be described in detail.

[Chemical Formula 12]

6.4 g (10 mmol) of dodecacarbonyltriruthenium and 3.3 g (30 mmol) of N-isopropylcrotonaldimine were added in a flask containing 500 ml of heptane, and the mixture was heated and stirred for 20 hours. The mixture was cooled to room temperature, the solvent was then distilled off under a reduced pressure, and purification was performed by a silica gel column with hexane as a developing solvent. Sublimation/purification was further performed to obtain 2.1 g (4.4 mmol) of hexacarbonyl[μ-[η:η$^3$-1-[[(1-methylethyl)imino] ethenylidene]-1,2-ethanediyl-N]]diruthenium (Ru—Ru) as an intended product (yield: 29%, melting point: 55° C.). $^1$H NMR (CDCl$_3$): δ8.02 (1H, s), 3.82 (1H, s), 3.59-3.53 (1H, m), 3.41 (1H, s), 3.32 (1H, s), 1.23 (3H, d), 1.17 (3H, d).

EXAMPLE 5

Hexacarbonyl[μ-[η:η$^3$-1-[[(1-methylpropyl)imino]ethenylidene]-1,2-ethanediyl-N]]diruthenium (Ru—Ru) was produced. The synthesis reaction formula is as described below. Hereinafter, the production process will be described in detail.

[Chemical Formula 13]

6.4 g (10 mmol) of dodecacarbonyltriruthenium and 3.8 g (30 mmol) of N-sec-butylcrotonaldimine were added in a flask containing 500 ml of heptane, and the mixture was refluxed for 20 hours. The mixture was cooled to room temperature, the solvent was then distilled off under a reduced pressure, and purification was performed by a silica gel column with hexane as a developing solvent. Distillation was further performed to obtain 0.69 g (1.4 mmol) of hexacarbonyl[μ-[η:η$^3$-1-[[(1-methylpropyl)imino]ethenylidene]-1,2-ethanediyl-N]]diruthenium (Ru—Ru) as an intended product (yield: 9%, melting point <−20° C.). $^1$H NMR (CDCl3): δ7.98 (1H, d), 3.82 (1H, d), 3.43-3.12 (3H, m), 1.65-1.43 (2H, m), 1.21-1.15 (3H, m), 1.90-0.82 (3H, m).

Figure 1:
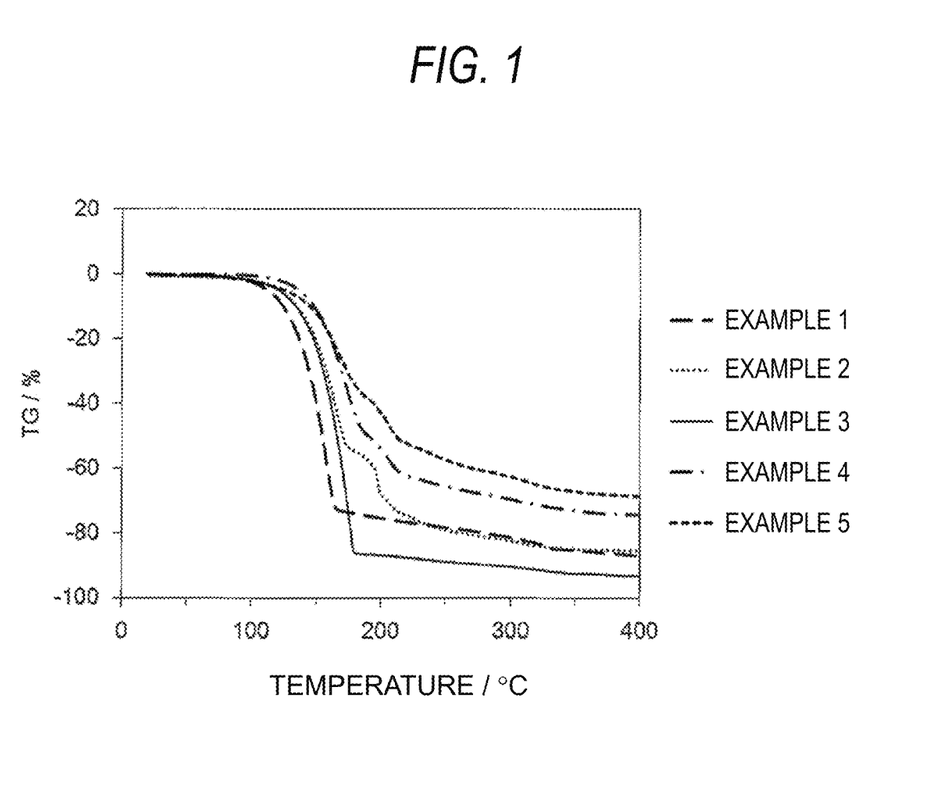
FIG. 1 illustrates a TG curve of a ruthenium complex in an embodiment.
Figure 2:
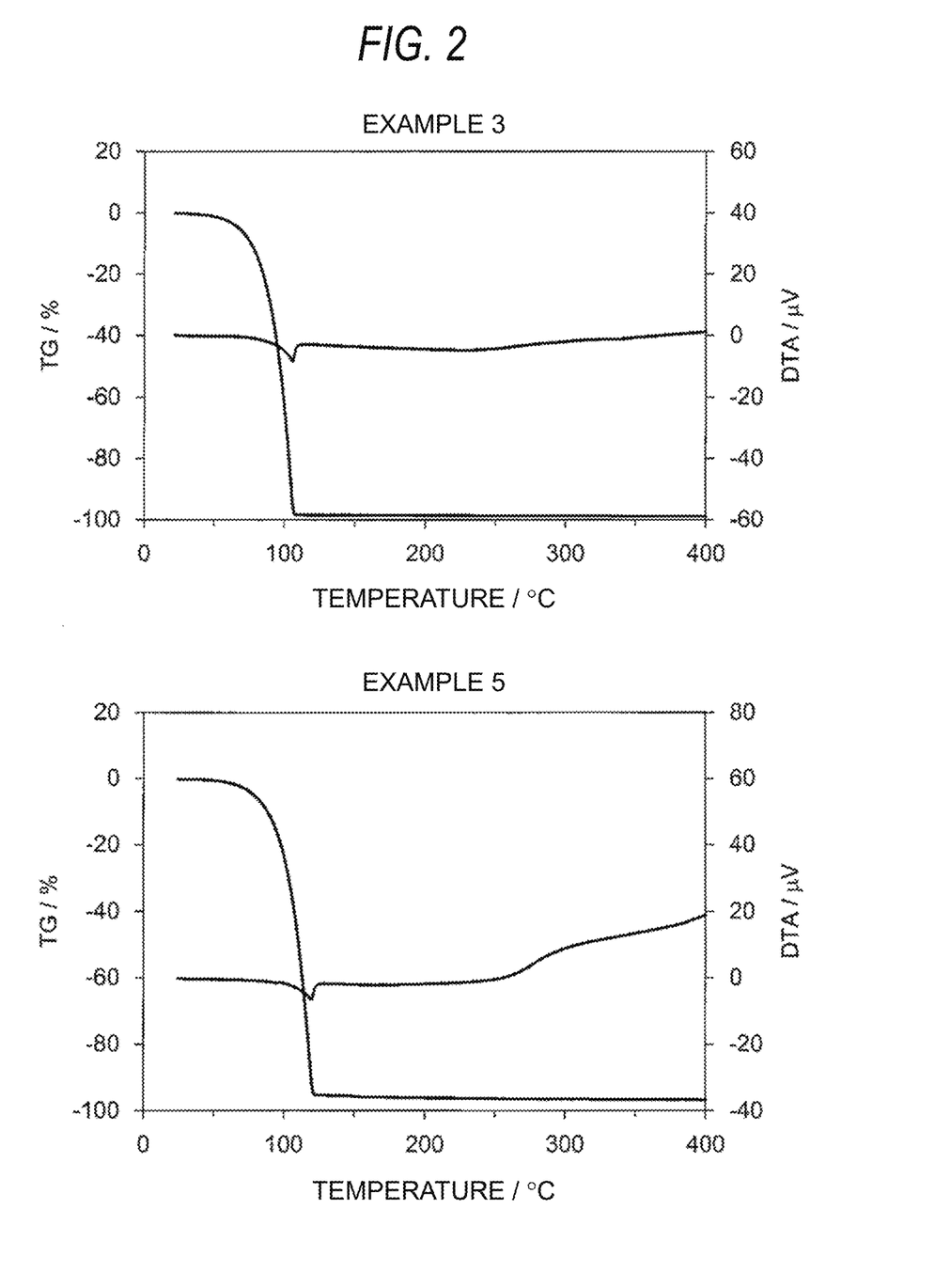
FIG. 2 illustrates a TG-DTA curve at a reduced pressure of a ruthenium complex in an embodiment.

Evaluation of Physical Properties: physical properties were evaluated by TG-DTA for each of the ruthenium complexes synthesized as described above. Analysis was performed by observing a change in heat amount and weight of a ruthenium complex sample (mass: 5 mg) in heating of the sample at a temperature elevation rate of 5° C./min over a measurement temperature range, i.e. from room temperature to 400° C., under a nitrogen atmosphere in TG-DTA2000SA manufactured by BRUKER Corporation. In addition, the complexes of Example 3 and Example 5 were measured under a reduced pressure (5 torr). The results are shown in FIGS. 1 and 2. Decomposition temperatures read from the results of DTA are shown in the table below. In this table, the decomposition temperature of dodecacarbonyltriruthenium as the complex disclosed in Patent Document 1 is also shown as a comparative example.

TABLE 1

|  | Decomposition temperature |
| --- | --- |
| Example 1 | 167° C. |
| Example 2 | 172° C. |
| Example 3 | 180° C. |
| Example 4 | 184° C. |
| Example 5 | 176° C. |
| Comparative example | 155° C. |

The results of TG in FIG. 1 and Table 1 indicate that the complexes of Examples 1 to 5 were thermally decomposed at a temperature of about 165 to 200° C., and each had improved thermal stability as compared to the complex of the comparative example. In particular, for the complexes of Examples 1 to 3, the amount of residues after heating was small, and thus excellent vaporization property was exhibited.

Next, in TG-DTA under a reduced pressure in FIG. 2, evaluation was performed for Example 5 showing the largest amount of residues after heating and Example 3 showing the smallest amount of residues after heating in FIG. 1, the result showed that in each of Examples 3 and 5, there were little residues after heating, and thus excellent vaporization property was exhibited.

Film Formation Test: Next, a film formation test was conducted in which a ruthenium thin film was formed by a CVD method with the ruthenium complex produced in Example 3 as a raw material compound.

Figure 3:
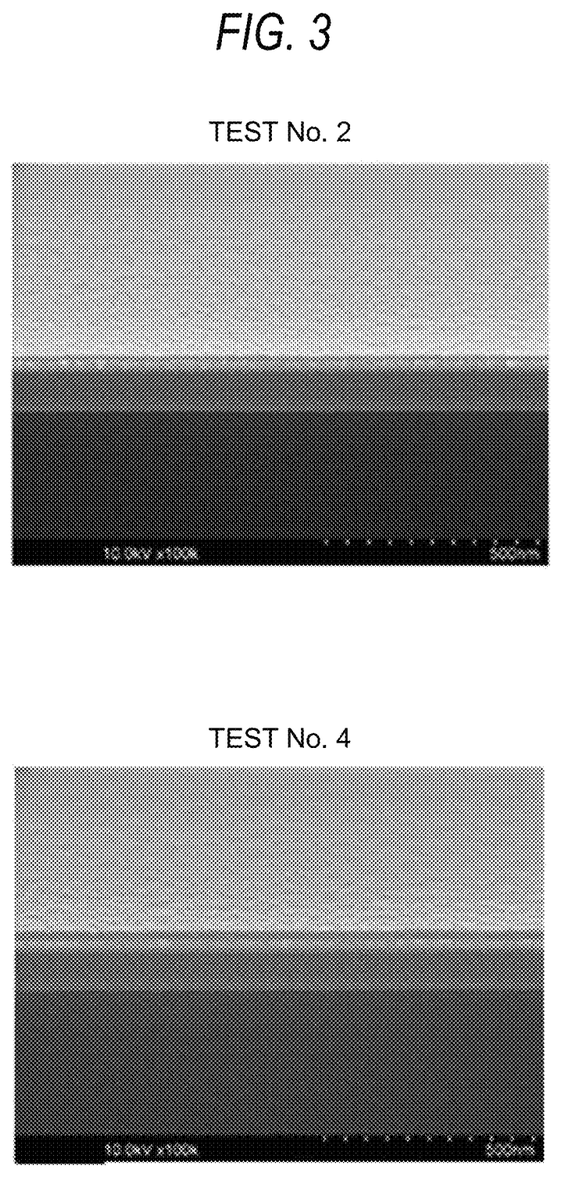
FIG. 3 shows photographs of a cross-section of a ruthenium thin film in an embodiment.

A ruthenium thin film was formed on a Ta/TH-Ox/Si substrate. As a film formation apparatus, a hot wall type thermal CVD apparatus was used. A reaction gas was fed at a constant flow rate by use of a mass flow controller. Film formation conditions are as described below. A SEM observation photograph of the formed ruthenium thin film is shown in FIG. 3. In addition, the results of measuring the thickness of the thin film are shown in the table below.

Substrate: Ta/TH-Ox/Si
Film formation temperature: 150° C., 200° C. and 250° C.
Sample temperature: 60° C.
Film formation pressure: 5 torr
Type of gas: argon or hydrogen
Gas flow rate: 20 sccm
Film formation time: 15 minutes

TABLE 2

| Test No. | Gas | Film formation temperature |
|---|---|---|
| 1 | Argon | 250° C. |
| 2 | | 200° C. |
| 3 | Hydrogen | 250° C. |
| 4 | | 200° C. |
| 5 | | 150° C. |

TABLE 3

| Test No. | Thickness (nm) |
|---|---|
| 1 | 51.6 |
| 2 | 15.9 |
| 3 | 210.3 |
| 4 | 29.8 |
| 5 | 14.2 |

The results in Table 3 and FIG. 3 indicate that the thin film formed by use of the complex of each of examples had a smooth and uniform surface. In particular, in the film formation test with hydrogen as a reaction gas, it was able to form a film even at a low temperature of about 150° C. The specific resistance after annealing treatment was less than 50 μΩ·cm, and thus a Ru thin film having low resistance was obtained. When the ruthenium complex produced in each of Examples 1, 2, 4 and 5 was used as a raw material compound, results having the same tendency as described above were obtained.

INDUSTRIAL APPLICABILITY

A raw material according to the present invention is capable of producing a high-purity ruthenium thin film, and has a low melting point and moderate thermal stability. Thus, the raw material according to the present invention is suitable for use in electrodes of various kinds of devices.

The invention claimed is:

1. A chemical vapor deposition raw material for producing a ruthenium thin film or a ruthenium compound thin film by a chemical deposition method, comprising a dinuclear ruthenium complex in which carbonyl and a nitrogen-containing organic ligand (L) are coordinated to metallically bonded two rutheniums, the dinuclear ruthenium complex being represented by the following formula (1):

[Chemical Formula 1]

(1)

wherein L represents an organic ligand containing one nitrogen atom, the ligand being represented by the following formula (L-1) or (L-2):

[Chemical Formula 2]

(L-1)

(L-2)

wherein * represents a position of an atom bridge-coordinated to ruthenium; and $R_1$ and $R_4$ are either an ethyl group or an iso-propyl group, and $R_2$, $R_3$, and $R_5$ to $R_8$ may be the same or different, and each represent any one of a hydrogen atom and an alkyl group with a carbon number of 1 or more and 4 or less.

2. The chemical vapor deposition raw material according to claim 1, wherein the total number of carbon atoms in substituents $R_1$ to $R_3$ is 3 or more and 10 or less.

3. The chemical vapor deposition raw material according to claim 2, wherein is an ethyl group, a propyl group or a butyl group.

4. The chemical vapor deposition raw material according to claim 2, wherein $R_2$ represents a hydrogen atom or a methyl group.

5. The chemical vapor deposition raw material according to claim 2, wherein $R_5$, $R_6$, $R_7$ and $R_8$ may be the same or different, and each represent a hydrogen atom or a methyl group.

6. The chemical vapor deposition raw material according to claim 2, wherein represents a branched alkyl group.

7. The chemical vapor deposition raw material according to claim 1, wherein the total number of carbon atoms in substituents $R_4$ to $R_8$ is 2 or more and 10 or less.

8. The chemical vapor deposition raw material according to claim 7, wherein is an ethyl group, a propyl group or a butyl group.

9. The chemical vapor deposition raw material according to claim 7, wherein $R_2$ represents a hydrogen atom or a methyl group.

10. The chemical vapor deposition raw material according to claim 7, wherein $R_5$, $R_6$, $R_7$ and $R_8$ may be the same or different, and each represent a hydrogen atom or a methyl group.

11. The chemical vapor deposition raw material according to claim 7, wherein represents a branched alkyl group.

12. The chemical vapor deposition raw material according to claim 1, wherein is an ethyl group, a propyl group or a butyl group.

13. The chemical vapor deposition raw material according to claim 1, wherein $R_2$ represents a hydrogen atom or a methyl group.

14. The chemical vapor deposition raw material according to claim 1, wherein $R_5$, $R_6$, $R_7$ and $R_8$ may be the same or different, and each represent a hydrogen atom or a methyl group.

15. The chemical vapor deposition raw material according to claim 1, wherein represents a branched alkyl group.

16. A method for chemical deposition of a ruthenium thin film or a ruthenium compound thin film, comprising preparing a raw material gas by vaporizing a raw material including a dinuclear ruthenium complex, and heating the raw material gas while introducing the raw material gas to a substrate surface, the method using the chemical vapor deposition raw material defined in claim 1 as the raw material.

17. A method for chemical deposition of a ruthenium thin film or a ruthenium compound thin film, comprising preparing a raw material gas by vaporizing a raw material including a dinuclear ruthenium complex, and heating the raw material gas while introducing the raw material gas to a substrate surface, the method using the chemical vapor deposition raw material defined in claim 2 as the raw material.

* * * * *